United States Patent
Zhao

(10) Patent No.: US 11,710,791 B2
(45) Date of Patent: Jul. 25, 2023

(54) SEMICONDUCTOR STRUCTURE WITH INVERSION LAYER BETWEEN STRESS LAYER AND PROTECTION LAYER AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Meng Zhao, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 38 days.

(21) Appl. No.: 17/227,682

(22) Filed: Apr. 12, 2021

(65) Prior Publication Data
US 2021/0320208 A1    Oct. 14, 2021

(30) Foreign Application Priority Data
Apr. 14, 2020    (CN) .......................... 202010291628.7

(51) Int. Cl.
*H01L 29/78*    (2006.01)
*H01L 21/265*    (2006.01)
(Continued)

(52) U.S. Cl.
CPC .... *H01L 29/7848* (2013.01); *H01L 21/26513* (2013.01); *H01L 29/0847* (2013.01); *H01L 29/167* (2013.01); *H01L 29/401* (2013.01); *H01L 29/41725* (2013.01); *H01L 29/66545* (2013.01); *H01L 29/66636* (2013.01)

(58) Field of Classification Search
CPC ............. H01L 21/26513; H01L 29/167; H01L 29/165; H01L 21/823418–823425; H01L 21/823814; H01L 29/0843–0886; H01L 29/06; H01L 29/0603; H01L 29/0615; H01L 29/0619; H01L 29/0623; H01L 29/0638; H01L 29/0646; H01L 29/7848;
(Continued)

(56) References Cited

U.S. PATENT DOCUMENTS 10,522,656 B2 * 12/2019 Chan ................ H01L 21/823821
2019/0348500 A1 * 11/2019 Glass ................ H01L 21/02603
(Continued)

*Primary Examiner* — Sonya McCall-Shepard
(74) *Attorney, Agent, or Firm* — Anova Law Group, PLLC

(57) ABSTRACT

A semiconductor structure and a method for forming the semiconductor structure are provided. The semiconductor structure includes a substrate and a gate structure on the substrate. The substrate contains source-drain openings on both sides of the gate structure. The semiconductor structure also includes a first stress layer formed in a source-drain opening of the source-drain openings. The first stress layer is doped with first ions. In addition, the semiconductor structure includes a protection layer over the first stress layer, and an inversion layer between the first stress layer and the protection layer. The protection layer is doped with second ions, and the inversion layer is doped with third ions. A conductivity type of the third ions is opposite to a conductivity type of the second ions.

18 Claims, 11 Drawing Sheets

(51) Int. Cl.
*H01L 29/08* (2006.01)
*H01L 29/167* (2006.01)
*H01L 29/40* (2006.01)
*H01L 29/417* (2006.01)
*H01L 29/66* (2006.01)
*H01L 29/06* (2006.01)
*H01L 29/165* (2006.01)

(58) Field of Classification Search
CPC ......... H01L 29/66636; H01L 29/66803; H01L 29/0847; H01L 29/66628; H01L 29/78
See application file for complete search history.

(56) References Cited

U.S. PATENT DOCUMENTS

2020/0020774 A1* 1/2020 Lee .................. H01L 29/66439
2020/0176566 A1* 6/2020 Peng ................ H01L 21/02502

\* cited by examiner

SEMICONDUCTOR STRUCTURE WITH INVERSION LAYER BETWEEN STRESS LAYER AND PROTECTION LAYER AND FABRICATION METHOD THEREOF

CROSS-REFERENCE TO RELATED APPLICATIONS

This application claims the priority of Chinese patent application No. 202010291628.7, filed on Apr. 14, 2020, the entirety of which is incorporated herein by reference.

FIELD OF THE DISCLOSURE

The present disclosure generally relates to the field of semiconductor manufacturing technology and, more particularly, relates to a semiconductor structure and a fabrication method thereof.

BACKGROUND

With the rapid development of integrated circuit manufacturing technology, size of a semiconductor device in the integrated circuit continuously reduces, such that the operating speed of the entire integrated circuit is effectively improved. In an ultra-large scale integrated circuit, the carrier mobility of a transistor increases by applying stress on the transistor, to increase a driving current of the transistor.

However, the performance of the existing semiconductor device still needs to be improved. The disclosed methods and device structures are directed to solve one or more problems set forth above and other problems.

BRIEF SUMMARY OF THE DISCLOSURE

One aspect of the present disclosure includes a semiconductor structure. The semiconductor structure includes a substrate and a gate structure on the substrate. The substrate contains source-drain openings on both sides of the gate structure. The semiconductor structure also includes a first stress layer formed in a source-drain opening of the source-drain openings. The first stress layer is doped with first ions. In addition, the semiconductor structure includes a protection layer over the first stress layer, and an inversion layer between the first stress layer and the protection layer. The protection layer is doped with second ions, and the inversion layer is doped with third ions. A conductivity type of the third ions is opposite to a conductivity type of the second ions.

Optionally, the first stress layer contains a trench, and the inversion layer is formed on sidewall and bottom surfaces of the trench.

Optionally, the protection layer is formed on the inversion layer, and is in contact with the inversion layer.

Optionally, the semiconductor structure further includes a second stress layer over the inversion layer. The second stress layer is in contact with the inversion layer and the protection layer.

Optionally, a thickness of the inversion layer is in a range of approximately 2 nm-5 nm, and a concentration of the third ions doped in the inversion layer is in a range of approximately $1\times10^{19}$ atoms/cm$^3$-$5\times10^{19}$ atoms/cm$^3$.

Optionally, the first ions and the second ions have a same conductivity type, and each of the first ions and the second ions includes an N-type ion or a P-type ion. The N-type ion includes phosphorus ion or arsenic ion, and the P-type ion includes boron ion, indium ion, or $BF^{2+}$.

Optionally, the third ions include an N-type ion or a P-type ion. The N-type ion includes phosphorus ion or arsenic ion, and the P-type ion includes boron ion, indium ion, or $BF^{2+}$.

Optionally, the semiconductor structure further includes a third stress layer on sidewall and bottom surfaces of the source-drain opening. The first stress layer is formed on the third stress layer. The third stress layer is doped with fourth ions, and the fourth ions have a same conductivity type as the first ions.

Optionally, a portion of each of the protection layer, the inversion layer, and the first stress layer is further doped with fifth ions, and a conductivity type of the fifth ions is the same as a conductivity type of the first ions.

Optionally, the semiconductor structure further includes: a stop barrier layer on a surface of the protection layer and on a sidewall surface of the gate structure; a dielectric layer on the stop barrier layer, where the dielectric layer has a top surface over or coplanar with a top surface of the gate structure, and the dielectric layer contains an opening having a bottom exposing a top surface of the protection layer; and a conductive plug in the opening.

Optionally, the gate structure includes a gate dielectric layer on the substrate, a gate electrode layer on the gate dielectric layer, and a sidewall spacer on sidewall surfaces of the gate dielectric layer and the gate electrode layer.

Another aspect of the present disclosure includes a method for forming a semiconductor structure. The method includes providing a substrate and forming a dummy gate structure on the substrate. The method also includes forming source-drain openings in the substrate on both sides of the dummy gate structure, and forming a first stress layer in a source-drain opening of the source-drain openings. The first stress layer is doped with first ions. In addition, the method includes forming a protection layer over the first stress layer. The protection layer is doped with second ions. Further, the method includes forming an inversion layer between the first stress layer and the protection layer. The inversion layer is doped with third ions, and a conductivity type of the third ions is opposite to a conductivity type of the second ions.

Optionally, the first stress layer contains a trench, and the inversion layer is formed on sidewall and bottom surfaces of the trench.

Optionally, before forming the protection layer, the inversion layer is formed.

Optionally, after forming the first stress layer, the inversion layer is formed on the first stress layer, and the protection layer is formed on the inversion layer.

Optionally, after forming the inversion layer and before forming the protection layer, the method further includes forming a second stress layer on the inversion layer, and forming the protection layer on the second stress layer.

Optionally, forming the inversion layer includes a selective epitaxial growth process, and doping the protection layer with the third ions includes an in-situ ion doping process.

Optionally, the method further includes: after forming the source-drain openings and before forming the first stress layer, forming a third stress layer on sidewall and bottom surfaces of the source-drain opening; and after forming the third stress layer, forming the first stress layer in the source-drain opening, where the first stress layer is formed on the third stress layer.

Optionally, the method further includes: forming a stop barrier layer on the protection layer and on a sidewall surface of the dummy gate structure; forming a dielectric layer on the stop barrier layer, where the dielectric layer has a top surface over or coplanar with a top surface of the dummy gate structure; forming an opening in the dielectric layer, where the opening has a bottom exposing a top surface of the protection layer; and forming a conductive plug in the opening.

Optionally, after forming the opening and before forming the conductive plug, the method further includes: performing an ion implantation process on the bottom of the opening, to dope a portion of each of the protection layer, the inversion layer, and the first stress layer with fifth ions. A conductivity type of the fifth ions is the same as a conductivity type of the first ions.

The disclosed embodiments may have following beneficial effects. In the disclosed semiconductor structure, the inversion layer may be formed between the first stress layer and the protection layer. The inversion layer may be doped with third ions, the protection layer may be doped with second ions, and the conductivity type of the third ions may be opposite to the conductivity type of the second ions. Because the conductivity type of the inversion layer is opposite to the conductivity type of the protection layer, the inversion layer may effectively block the doped ions in the protection layer, and may prevent the doped ions in the protection layer from diffusing into the region under the gate structure. In other words, the inversion layer may effectively reduce the influence of doped ions on the channel width, and may further improve the short-channel effect, which may facilitate to improve the performance of the formed semiconductor structure.

The semiconductor structure may further include a second stress layer on the inversion layer. The inversion layer may be formed between the first stress layer and the second stress layer. The inversion layer may have a substantially large area, which may facilitate the inversion layer to effectively block the doped ions in the protection layer, and may effectively prevent the doped ions in the protection layer from diffusing into the region under the gate structure. Therefore, the inversion layer may effectively reduce the influence of the doped ions on the channel width, and may improve the short-channel effect, which may facilitate to improve the performance of the formed semiconductor structure.

Further, a portion of each of the protection layer, the inversion layer, and the first stress layer may be doped with fifth ions, and the conductivity type of the fifth ions may be the same as the conductivity type of the first ions. Doping the fifth ions may facilitate to reduce the resistivity and improve the conductivity. At the same time, the concentration of doped ions in the first stress layer under the opening may be substantially high. In other words, ions may be doped with a substantially high concentration within a substantially small range, and may not easily diffuse into the channel under the gate structure. Accordingly, the performance of the formed semiconductor structure may be further improved.

In the disclosed method for forming a semiconductor structure, the inversion layer may be formed between the first stress layer and the protection layer. The inversion layer may be doped with third ions, the protection layer may be doped with second ions, and the conductivity type of the third ions may be opposite to the conductivity type of the second ions. Because the conductivity type of the inversion layer is opposite to the conductivity type of the protection layer, the inversion layer may effectively block the doped ions in the protection layer, and may prevent the doped ions in the protection layer from diffusing into the region under the gate structure. In other words, the inversion layer may effectively reduce the influence of doped ions on the channel width, and may further improve the short-channel effect, which may facilitate to improve the performance of the formed semiconductor structure.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
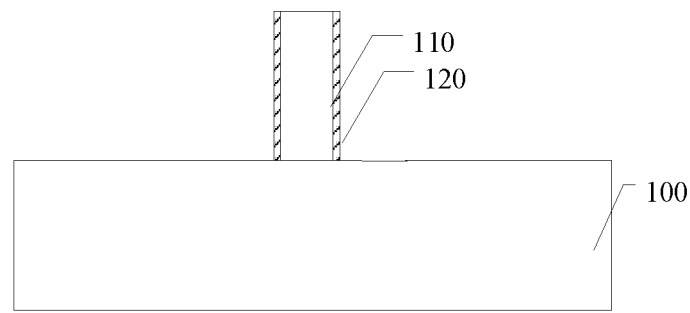
FIGS. 1-4 illustrate schematic diagrams of semiconductor structures corresponding to certain stages for forming a semiconductor structure.

FIGS. 1-4 illustrate schematic diagrams of semiconductor structures corresponding to certain stages for forming a semiconductor structure. Referring to FIG. 1, a substrate 100 is provided. A dummy gate structure 110 is formed on the substrate 100, and a sidewall spacer 120 is formed on both sides of the dummy gate structure 110.

Figure 2:
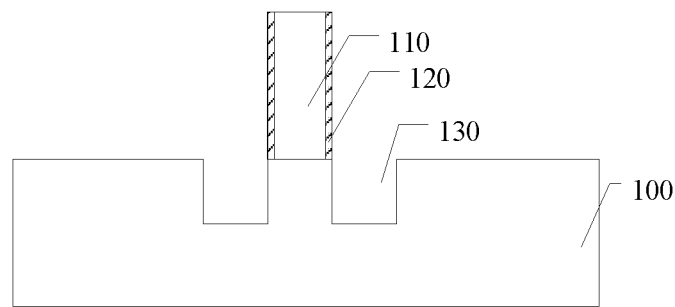

Referring to FIG. 2, source-drain openings 130 are formed in the substrate 100 on both sides of the dummy gate structure 110 and the sidewall spacer 120.

Figure 3:
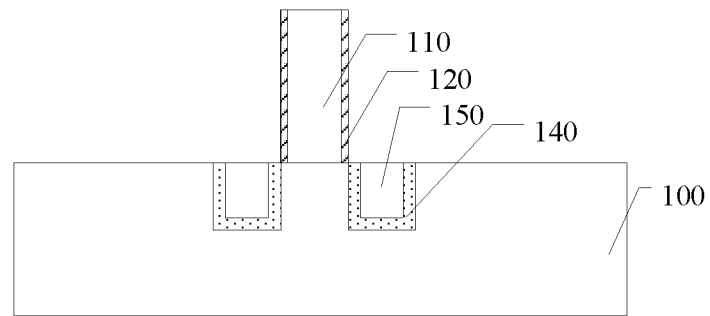

Referring to FIG. 3, a first stress layer 140 is formed at the bottom and on the sidewall surface of the source-drain opening 130. A second stress layer 150 is formed on the first stress layer 140.

Figure 4:
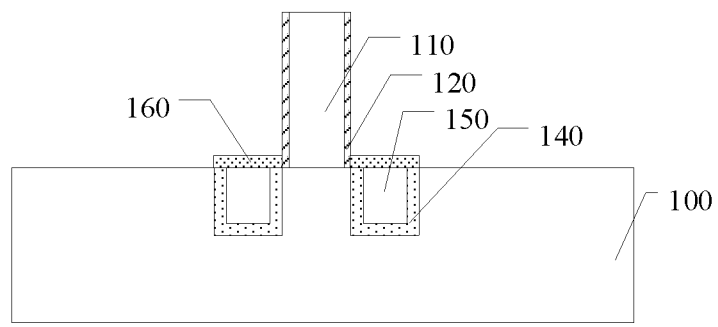

Referring to FIG. 4, a protection layer 160 is formed on the second stress layer 150.

In the above method, the first stress layer 140 and the second stress layer 150 jointly form the source-drain doped region. The protection layer 160 on the second stress layer 150 is capable of effectively reducing the stress release of the source-drain doped region, especially the second stress layer 150, caused by heating during the subsequent thermal process. Therefore, the protection layer 160 facilitates to maintain the stress of the source-drain doped region.

However, forming the protection layer 160 includes a selective epitaxial growth process, and the protection layer 160 is doped with ions by an in-situ ion doping process. Specifically, the protection layer 160 is made of silicon germanium, and the concentration of germanium in the silicon germanium material is substantially low. The doped ions are likely to diffuse in the protection layer 160 with a substantially low germanium concentration, and easily diffuse into a channel under the dummy gate structure 110, thereby causing a short-channel effect, and causing substantially poor performance of the semiconductor structure.

The present disclosure provides a semiconductor structure and a method for forming the semiconductor structure. An inversion layer may be formed between the first stress layer and the protection layer. The inversion layer may be doped with third ions, the protection layer may be doped with second ions, and the conductivity type of the third ions may be opposite to the conductivity type of the second ions. The inversion layer may block the doped ions in the protection layer, thereby preventing the doped ions in the protection layer from diffusing into a region under the gate structure. In other words, the inversion layer may effectively reduce the impact on the channel width and may improve the short channel effect, which may facilitate to improve the performance of the formed semiconductor structure.

Figure 20:
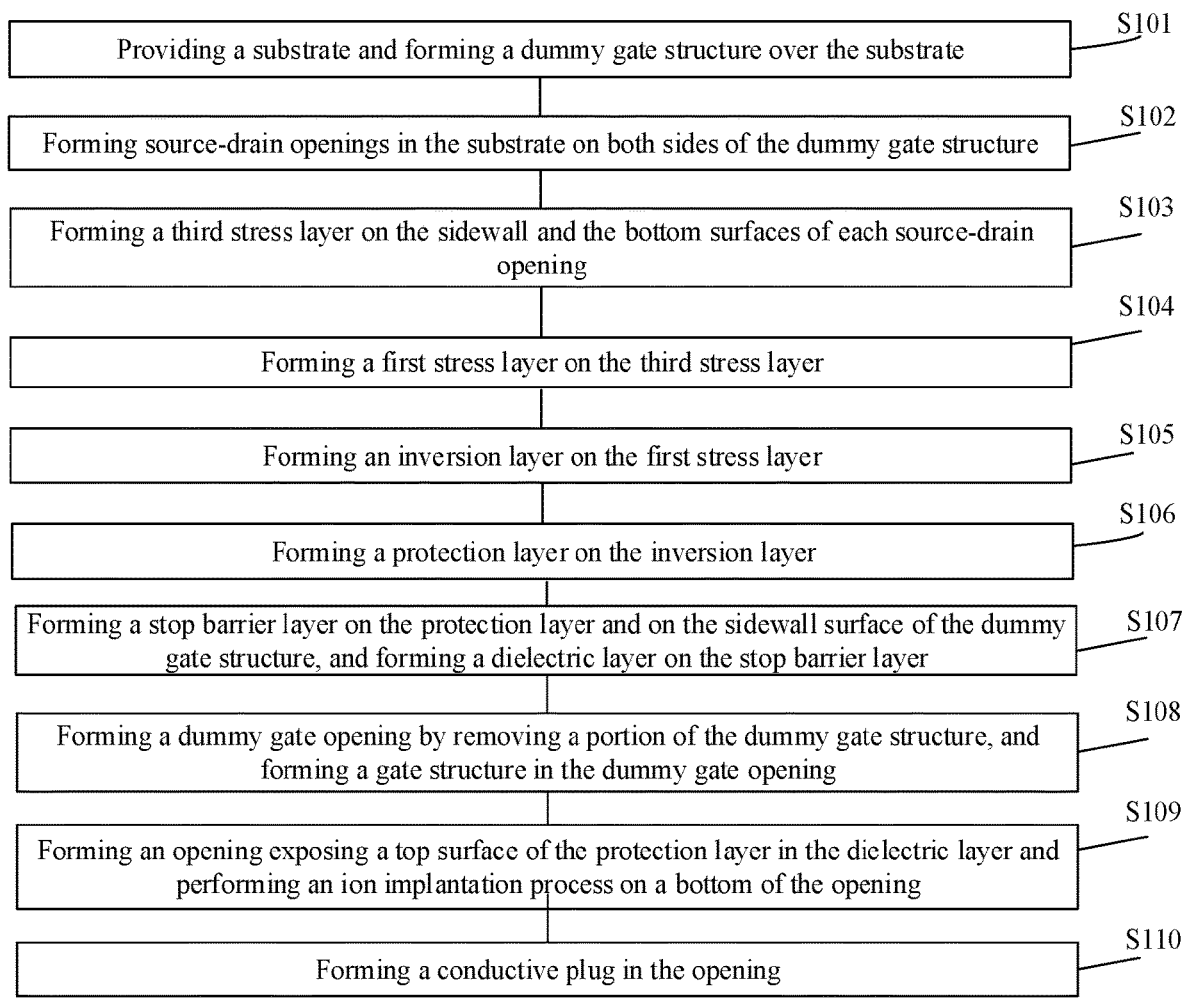
FIG. 20 illustrates a flowchart of an exemplary method for forming a semiconductor structure consistent with various disclosed embodiments of the present disclosure.

FIG. 20 illustrates a flowchart of a method for forming a semiconductor structure consistent with various disclosed embodiments of the present disclosure, and FIGS. 5-14 illustrate semiconductor structures corresponding to certain stages of the fabrication method.

Figure 5:
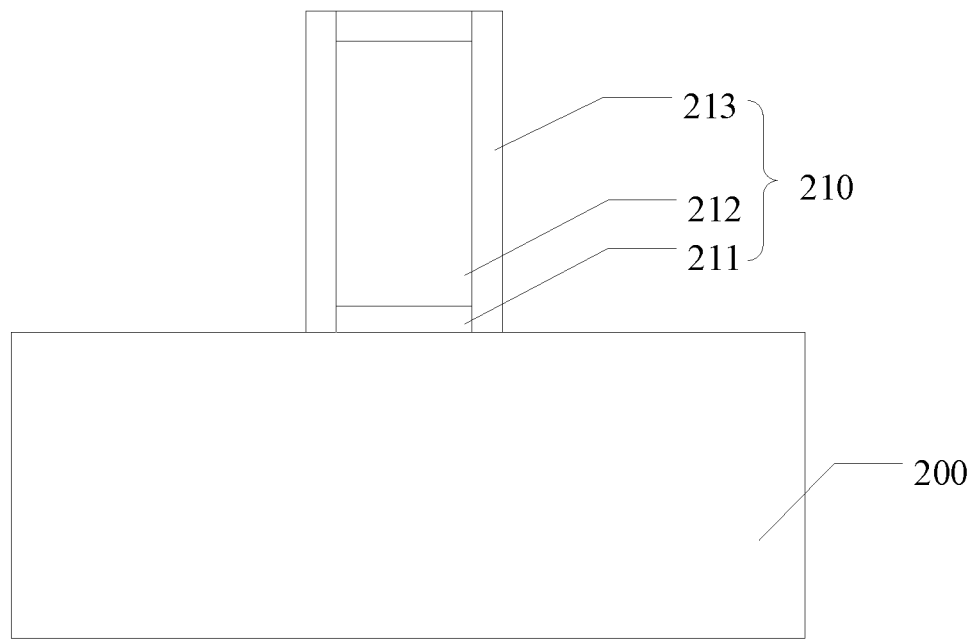
FIGS. 5-14 illustrate schematic diagrams of semiconductor structures corresponding to certain stages for forming an exemplary semiconductor structure consistent with various disclosed embodiments of the present disclosure.

As shown in FIG. 20, at the beginning of the fabrication method, a substrate may be provided and a dummy gate structure may be formed over the substrate (S101). FIG. 5 illustrates a corresponding semiconductor structure.

Referring to FIG. 5, a substrate 200 may be provided, and a dummy gate structure 210 may be formed on the substrate. In one embodiment, the substrate 200 may include a base and a fin on the base. The dummy gate structure 210 may be across the fin, and may cover a portion of the top surface and sidewall surface of the fin. In certain embodiments, the substrate may not include the fin on the base.

In one embodiment, forming the substrate 200 may include: providing an initial base (not illustrated); forming a first patterned layer on the initial base, where the first patterned layer may expose a portion of the initial base; and etching the initial base using the first patterned layer as a mask, to form the base and the fin on the base.

In one embodiment, the initial base may be made of silicon. Correspondingly, the base and the fin may be made of silicon. In certain embodiments, the material of the initial base may include germanium, silicon germanium, silicon-on-insulator, or germanium-on-insulator. Correspondingly, the material of the base may include germanium, silicon germanium, silicon-on-insulator, or germanium-on-insulator. The material of the fin may include germanium, silicon germanium, silicon-on-insulator, or germanium-on-insulator.

In one embodiment, the dummy gate structure 210 may include a dummy gate dielectric layer 211 on the substrate 200, a dummy gate electrode layer 212 on the dummy gate dielectric layer 211, and a sidewall spacer 213 on the sidewall surfaces of the dummy gate dielectric layer 211 and the dummy gate electrode layer 212.

The dummy gate dielectric layer 211 may be made of a material including one or more of a low-K dielectric material (dielectric constant greater than or equal to 2.5 and less than 3.9) and an ultra-low-K dielectric material (dielectric constant less than 2.5). In one embodiment, the dummy gate dielectric layer 211 may be made of silicon oxide. The dummy gate electrode layer 212 may be made of a material including polysilicon, or polycrystalline germanium. In one embodiment, the dummy gate electrode layer 212 may be made of polysilicon.

The sidewall spacer 213 may be made of a material including an insulating material. The insulating material may include silicon oxide, silicon nitride, silicon oxynitride, silicon oxycarbide, or silicon oxy-carbo-nitride. In one embodiment, the sidewall spacer 213 may be made of silicon nitride. In certain embodiments, the dummy gate structure may not include the sidewall spacer.

Forming the dummy gate structure 210 may include: forming a dummy gate dielectric film (not illustrated) on the substrate; forming a dummy gate electrode film (not illustrated) on the dummy gate dielectric film; patterning the dummy gate dielectric film and dummy gate electrode film until the surface of the substrate is exposed, where the dummy gate dielectric film may form the dummy gate dielectric layer 211, and the dummy gate electrode film may form the dummy gate electrode layer 212; forming a sidewall spacer material film on the top and sidewall surfaces of the dummy gate electrode layer 212, and on the sidewall surface of the dummy gate dielectric layer 211; and back-etching the sidewall spacer material film until the substrate surface is exposed, to form the sidewall spacer 213 on the sidewall surfaces of the dummy gate dielectric layer 211 and the dummy gate electrode layer 212.

In one embodiment, the method for forming the semiconductor structure may further include forming a barrier layer (not illustrated) on a top surface of the dummy gate structure 210. In one embodiment, the barrier layer may be made of silicon oxide. The barrier layer may be configured to protect the surface of the dummy gate structure 210 from being affected by subsequent process, and, thus, the dummy gate structure 210 may maintain a desired topography.

Figure 6:
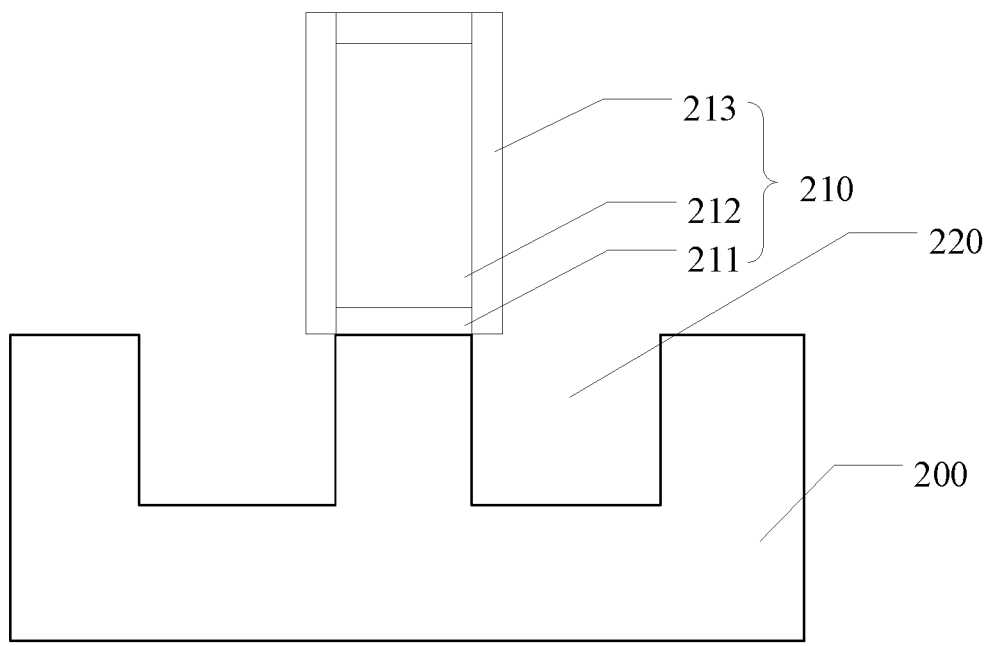

Returning to FIG. 20, after forming the dummy gate structure, source-drain openings may be formed in the substrate on both sides of the dummy gate structure (S102). FIG. 6 illustrates a corresponding semiconductor structure.

Referring to FIG. 6, source-drain openings 220 may be formed in the substrate 200 on both sides of the dummy gate structure 210, respectively. Each source-drain opening 220 may provide space for subsequently forming a first stress layer, an inversion layer and a third stress layer.

In one embodiment, the source-drain openings 220 may be located in the fin on both sides of the dummy gate structure 210. Forming the source-drain openings 220 may include etching the substrate 200 using the dummy gate structure as a mask to form the source-drain openings 220. In one embodiment, etching the substrate may include an anisotropic dry etching process.

Figure 7:
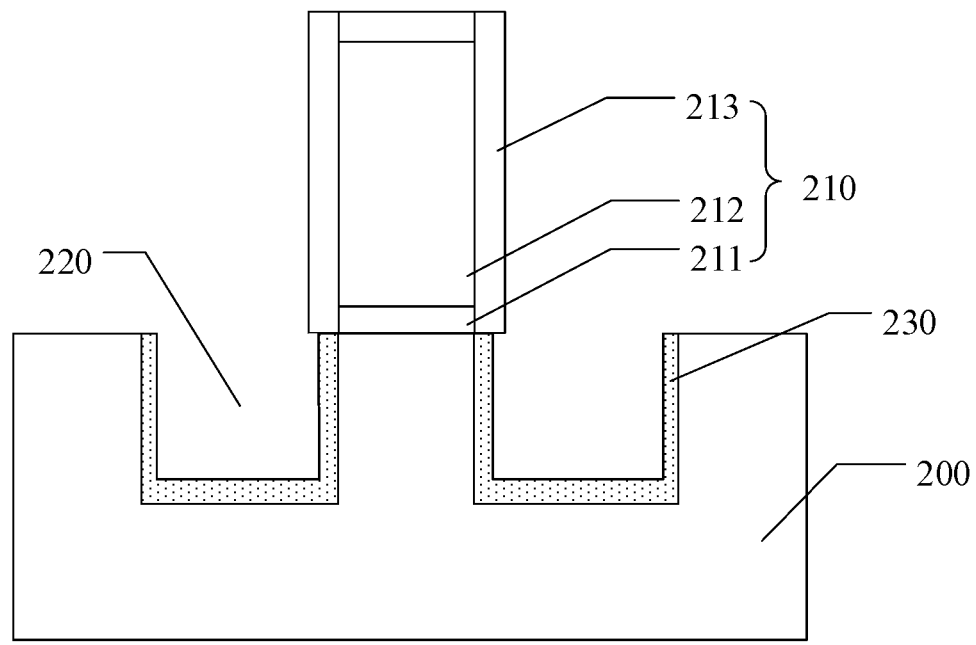

Returning to FIG. 20, after forming the source-drain openings, a third stress layer may be formed on the sidewall and the bottom surfaces of each source-drain opening (S103). FIG. 7 illustrates a corresponding semiconductor structure.

Referring to FIG. 7, a third stress layer 230 may be formed on the sidewall surface and the bottom surface of each source-drain opening 220. Forming the third stress layer 230 may include a selective epitaxial growth process. The third stress layer 230 may be doped with fourth ions using an in-situ ion doping process. A conductivity type of the fourth ions may be the same as a conductivity type of first ions doped in a subsequently formed first stress layer.

When the to-be-formed semiconductor structure is a P-type device, the third stress layer 230 may be made of a material including silicon germanium. When the to-be-formed semiconductor structure is an N-type device, the third stress layer 230 may be made of a material including carbon germanium.

The fourth ions may be an N-type ion or a P-type ion. The N-type ion may include phosphorus ion or arsenic ion; and the P-type ion may include boron ion, indium ion, or $BF^{2+}$.

In one embodiment, the to-be-formed semiconductor structure may be a P-type device, the third stress layer 230 may be made of silicon germanium, the doped fourth ions may be boron ions, the concentration of germanium in the silicon germanium material may be in a range of approximately 0.1-0.3, and the concentration of the boron ions may be in a range of approximately $1\times10^{18}$ atoms/cm$^3$-$1\times10^{19}$ atoms/cm$^3$. The concentration of germanium may refer to a ratio of the amount of germanium over the amount of silicon in the silicon germanium material.

Because the germanium concentration in the silicon germanium material of the third stress layer 230 is substantially low, the stress of the third stress layer 230 may be substantially small, which may effectively buffer the stress between the substrate 200 and the subsequently formed first stress layer with a substantially large stress.

Figure 8:
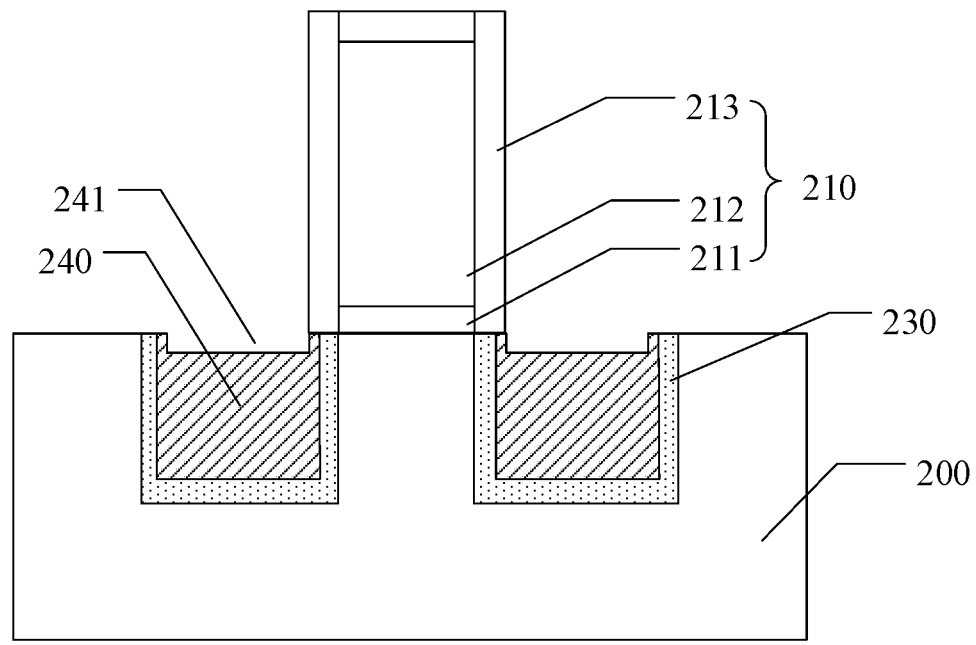

Returning to FIG. 20, after forming the third stress layer, a first stress layer may be formed on the third stress layer (S104). FIG. 8 illustrates a corresponding semiconductor structure.

Referring to FIG. 8, after forming the third stress layer 230, a first stress layer 240 may be formed on the third stress layer 230, and the first stress layer 240 may be doped with first ions. The first stress layer 240 and the third stress layer 230 together may be configured as a source-drain doped region.

In one embodiment, the first stress layer 240 and the third stress layer 230 may not fully fill the source-drain opening 220. In certain embodiments, the first stress layer and the third stress layer may fully fill the source-drain opening.

In one embodiment, a trench 241 may be formed in the first stress layer 240. Forming the first stress layer 240 and the trench 241 may include: forming an initial first stress layer (not illustrated) on the third stress layer 230 in the source-drain opening 220; and etching the initial first stress layer to form the first stress layer 240 and the trench 241 in the first stress layer 240. In one embodiment, the initial first stress layer may fully fill the source-drain opening 220.

Forming the initial first stress layer may include a selective epitaxial growth process. The initial first stress layer may be doped with the first ions using an in-situ ion doping process.

When the to-be-formed semiconductor structure is a P-type device, the first stress layer 240 may be made of a material including silicon germanium. When the to-be-formed semiconductor structure is an N-type device, the first stress layer 240 may be made of a material including carbon germanium.

The first ions may be an N-type ion or a P-type ion. The N-type ion may include phosphorus ion or arsenic ion; and the P-type ion may include boron ion, indium ion, or $BF^{2+}$. The first ions may be the same as or different from the fourth ions. In one embodiment, the first ions may be the same as the fourth ions, and may be boron ion.

In one embodiment, the first stress layer 240 may be made of silicon germanium, the doped first ions may be boron ions, the concentration of germanium in the silicon germanium material may be in a range of approximately 0.4-0.6, and the concentration of the boron ions may be in a range of approximately $1\times10^{20}$ atoms/cm$^3$-$1\times10^{21}$ atoms/cm$^3$. The germanium concentration in the silicon germanium material of the first stress layer 240 may be substantially high, and the first stress layer 240 may occupy a main volume of the source-drain opening 220. The first stress layer 240 may apply a substantially large stress on the channel, such that the first stress layer 240 and the third stress layer 230 in the source-drain opening 220 together may be configured as the source-drain doped region and may apply a substantially stress on the channel, which may facilitate to improve the carrier mobility, increase the driving current of the semiconductor device, and improve the response speed of the circuit.

Figure 9:
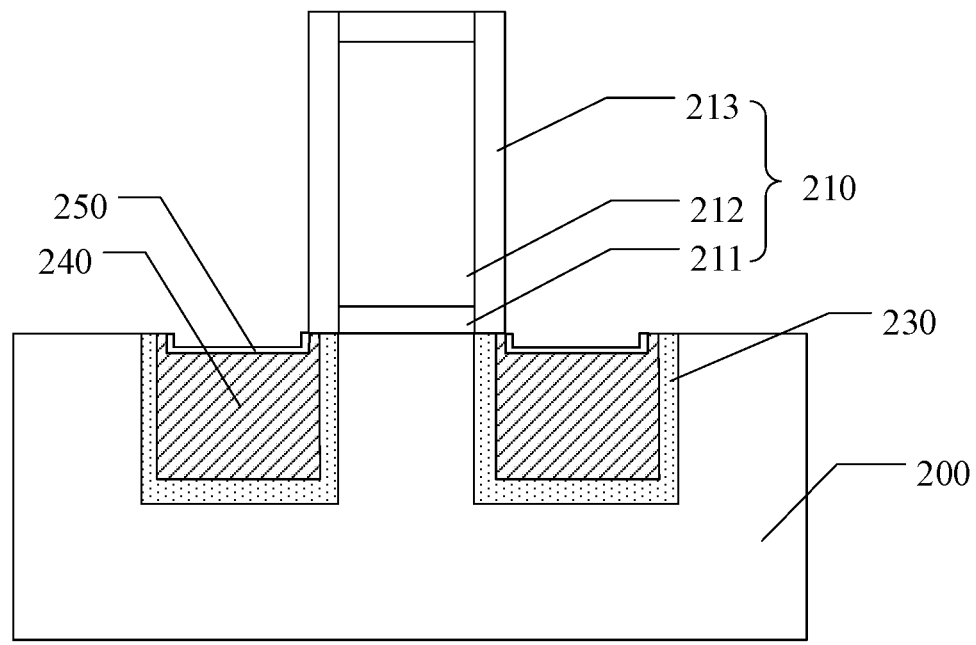

Returning to FIG. 20, after forming the first stress layer, an inversion layer may be formed on the first stress layer (S105). FIG. 9 illustrates a corresponding semiconductor structure.

Referring to FIG. 9, an inversion layer 250 may be formed on the first stress layer 240, and the inversion layer 250 may be doped with third ions. In one embodiment, the inversion layer 250 may be formed on the sidewall bottom surfaces of the trench 241 in the first stress layer 240. Forming the inversion layer 250 may include a selective epitaxial growth process. The inversion layer may be doped with the third ions using an in-situ ion doping process.

When the to-be-formed semiconductor structure is a P-type device, the inversion layer 250 may be made of a material including silicon germanium. When the to-be-formed semiconductor structure is an N-type device, the inversion layer 250 may be made of a material including carbon germanium.

The third ions may be an N-type ion or a P-type ion. The N-type ion may include phosphorus ion or arsenic ion; and the P-type ion may include boron ion, indium ion, or $BF^{2+}$. In one embodiment, a concentration of the third ions doped in the inversion layer 250 may be in a range of approximately $1\times10^{19}$ atoms/cm$^3$-$5\times10^{19}$ atoms/cm$^3$.

If the concentration of the third ions is greater than $5\times10^{19}$ atoms/cm$^3$, the doping concentration may be too high, which may easily cause too large series resistance and may affect the electrical performance of the semiconductor structure. If the concentration of the third ions is less than $1\times10^{19}$ atoms/cm$^3$, the doping concentration may be substantially low, and, thus, the inversion layer may not fully block the ions in the protection layer, may easily cause the ions in the protection layer to diffuse into the region under the dummy gate structure, which may affect the performance of the semiconductor structure.

In one embodiment, the inversion layer 250 may be made of silicon germanium, the doped third ions may be phosphorus ions, the concentration of germanium in the silicon germanium material may be approximately 0.2, and the concentration of phosphorus ions may be approximately $5\times10^{19}$ atoms/cm$^3$. A thickness of the inversion layer 250 may be in a range of approximately 2 nm-5 nm.

If the thickness of the inversion layer is less than 2 nm, the inversion layer 250 with a substantially thin thickness may not fully block the ions in the subsequently formed protection layer, and the formed semiconductor structure may have a substantially poor performance. If the thickness of the inversion layer is greater than 5 nm, the inversion layer 250 may occupy a substantially large space, which may reduce the integration degree of the device.

Figure 10:
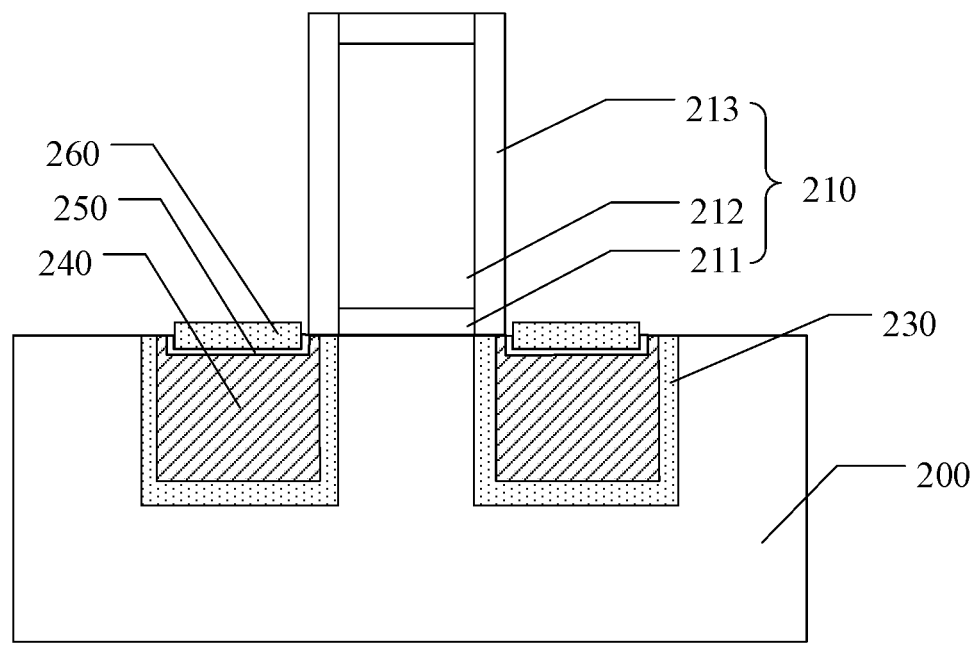

Returning to FIG. 20, after forming the inversion layer, a protection layer may be formed (S106). FIG. 10 illustrates a corresponding semiconductor structure.

Referring to FIG. 10, after the inversion layer 250 is formed, a protection layer 260 may be formed on the inversion layer 250. The protection layer 260 may be doped with second ions, and a conductivity type of the second ions may be opposite to the conductivity type of the third ions.

The protection layer 260 may effectively prevent the stress release of the first stress layer 240 caused by heating during the subsequent thermal process. Forming the protection layer 260 may include a selective epitaxial growth process. The protection layer 260 may be doped with the second ions using an in-situ ion doping process.

When the to-be-formed semiconductor structure is a P-type device, the protection layer 260 may be made of a material including silicon germanium. When the to-be-formed semiconductor structure is an N-type device, the protection layer 260 may be made of a material including carbon germanium.

In one embodiment, the protection layer 260 may be made of silicon germanium. The conductivity type of the second ions may be the same as the conductivity type of the first ions.

The second ions may be an N-type ion or a P-type ion. The N-type ion may include phosphorus ion or arsenic ion; and the P-type ion may include boron ion, indium ion, or $BF^{2+}$. The second ions may be the same as or different from the first ions. In one embodiment, the first ions may be the same as the second ions, and may include boron ions.

Because the conductivity type of the second ions is opposite to the conductivity type of the third ions, the conductivity type of the protection layer 260 may be opposite to the conductivity type of the inversion layer 250.

In one embodiment, the protection layer 260 may be made of silicon germanium, the doped second ions may be boron ions, the concentration of germanium in the silicon germanium material may be in a range of approximately 0.1-0.2, and the concentration of the boron ions may be in a range of approximately $5 \times 10^{19}$ atoms/cm$^3$-$5 \times 10^{20}$ atoms/cm$^3$.

The inversion layer 250 may be formed between the first stress layer 240 and the protection layer 260. The inversion layer 250 may be doped with third ions, and the conductivity type of the third ions may be opposite to the conductivity type of the second ions. Because the conductivity type of the inversion layer 250 is opposite to the conductivity type of the protection layer 260, the inversion layer 250 may effectively block the doped ions in the protection layer 260, and may prevent the doped ions in the protection layer 260 from diffusing into the region under the dummy gate structure 210. In other words, the inversion layer 250 may effectively reduce the influence on the channel width, and may further improve the short-channel effect, which may facilitate to improve the performance of the formed semiconductor structure.

Figure 11:
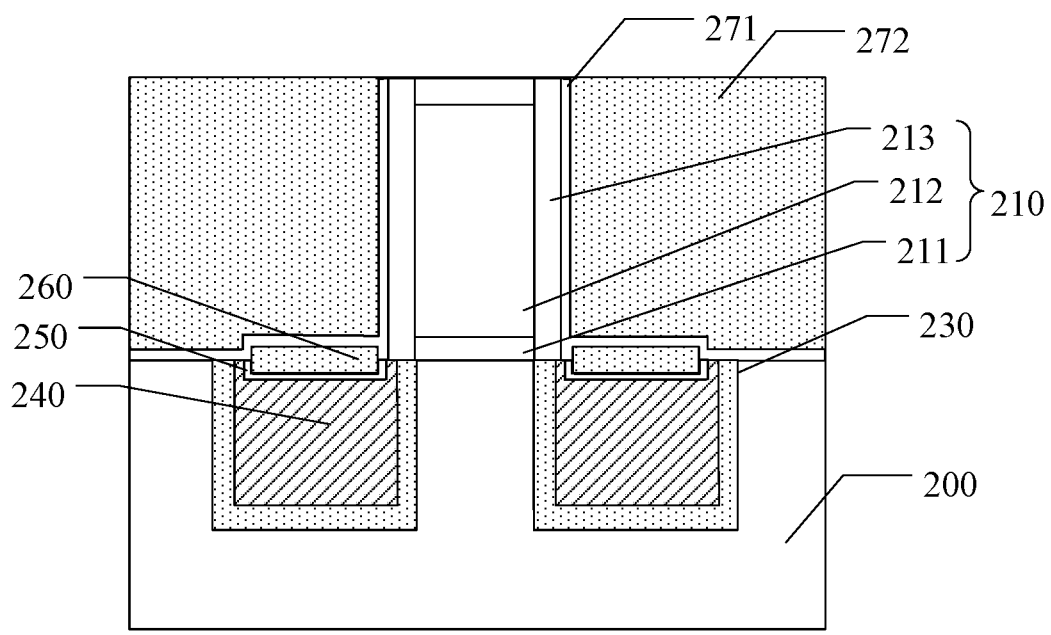

Returning to FIG. 20, after forming the protection layer, a stop barrier layer may be formed on the protection layer and on the sidewall surface of the dummy gate structure, and a dielectric layer may be formed on the stop barrier layer (S107). FIG. 11 illustrates a corresponding semiconductor structure.

Referring to FIG. 11, a stop barrier layer 271 may be formed on the protection layer 260 and on the sidewall surface of the dummy gate structure 210. A dielectric layer 272 may be formed on the stop barrier layer 271. A top surface of the dielectric layer 272 may be above or coplanar with the top surface of the dummy gate structure.

The stop barrier layer 271 may be configured as a stop layer for subsequent etching. The dielectric layer 272 may be configured to provide support for subsequently forming a device. The stop barrier layer 271 may be made of a material different from the dielectric layer 272. In one embodiment, the stop barrier layer 271 may be made of silicon nitride, and the dielectric layer 272 may be made of silicon oxide.

In one embodiment, a barrier layer (not illustrated) may be formed on the top surface of the dummy gate structure 210. The top surface of the dielectric layer 272 may be coplanar with the top surface of the barrier layer, and the dielectric layer 272 may expose the barrier layer on the top surface of the dummy gate structure 210.

Figure 12:
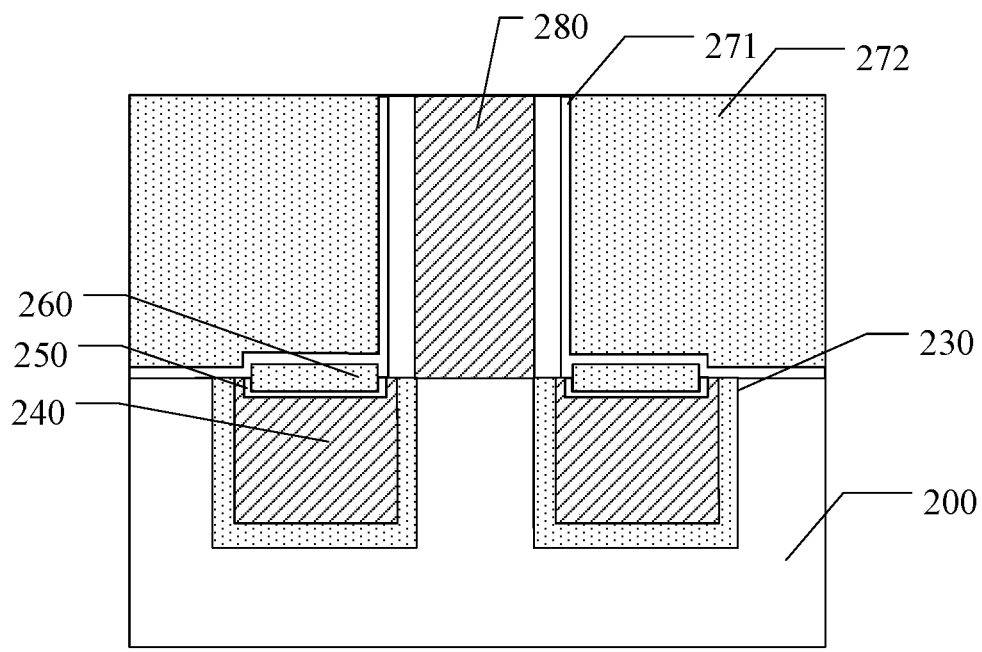

Returning to FIG. 20, after forming the dielectric layer, a portion of the dummy gate structure may be removed and a gate structure may be formed (S108). FIG. 12 illustrates a corresponding semiconductor structure.

Referring to FIG. 12, the dummy gate structure 210 may be removed to form a dummy gate opening (not illustrated) in the dielectric layer 272, and then a gate structure 280 may be formed in the dummy gate opening.

In one embodiment, removing the dummy gate structure 210 may refer to removing the dummy gate electrode layer 212 and the dummy gate dielectric layer 211 in the dummy gate structure 210, and maintaining the sidewall spacer 213, such that the sidewall spacer 213 may be used as a portion of the gate structure 280.

The gate structure 280 may include a gate dielectric layer (not illustrated) on the bottom and sidewall surfaces of the dummy gate opening, a gate electrode layer (not illustrated) on the gate dielectric layer, and the sidewall spacer 213 on the sidewall surfaces of the gate dielectric layer and the gate electrode layer. The gate electrode layer may fully fill the dummy gate opening.

The gate dielectric layer may be made of a material including a high-K dielectric material (dielectric constant greater than 3.9), e.g., hafnium oxide, zirconium oxide, hafnium oxide, lanthanum oxide, zirconium oxide, titanium oxide, tantalum oxide, barium strontium titanium oxide, barium titanium oxide, strontium titanium oxide, or aluminum oxide. In one embodiment, the gate dielectric layer may be made of hafnium oxide.

The gate electrode layer may be made of a material including metal, e.g., one or more of copper, tungsten, aluminum, titanium, nickel, titanium nitride, and tantalum nitride. In one embodiment, the gate electrode layer may be made of tungsten.

Figure 13:
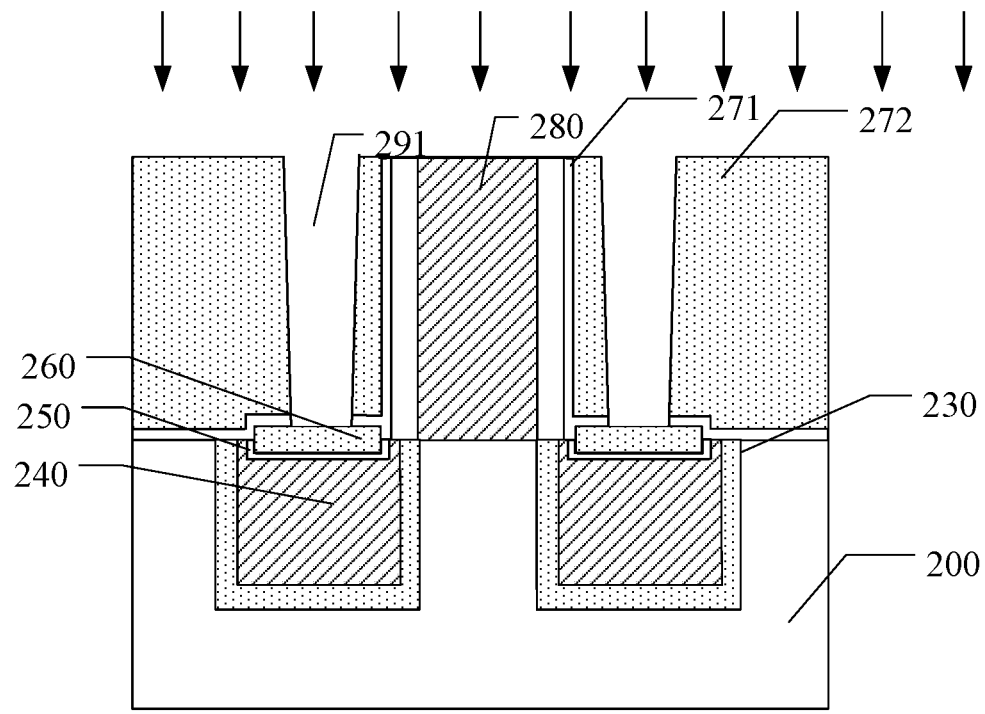

Returning to FIG. 20, after forming the gate structure, an opening exposing a top surface of the protection layer may be formed in the dielectric layer and an ion implantation process may be performed on a bottom of the opening (S109). FIG. 13 illustrates a corresponding semiconductor structure.

Referring to FIG. 13, an opening 291 may be formed in the dielectric layer 272, and the bottom of the opening 291 may expose the top surface of the protection layer 260. An ion implantation process may be performed on the bottom of the opening 291, to dope fifth ions in a portion of each of the protection layer 260, the inversion layer 250 and the first stress layer 240. The conductivity type of the fifth ions may be the same as the conductivity type of the first ions.

The fifth ions may be an N-type ion or a P-type ion. The fifth ions may be the same as or different from the first ions. In one embodiment, the fifth ions may be the same as the first ions, and may include boron ions.

After forming the opening 291 and before subsequently forming a conductive plug, the ion implantation process may be performed on the bottom of the opening 291, to dope the fifth ions in the portion of the protection layer 260, the inversion layer 250 and the first stress layer 240. The conductivity type of the fifth ions may be the same as the conductivity type of the first ions. Doping the fifth ions may facilitate to reduce the resistivity and improve the conductivity. At the same time, the concentration of doped ions in the first stress layer 240 under the opening 291 may be substantially high. In other words, ions may be doped with a substantially high concentration within a substantially small range, and may not easily diffuse into the channel under the gate structure 280. Accordingly, the performance of the formed semiconductor structure may be further improved.

Figure 14:
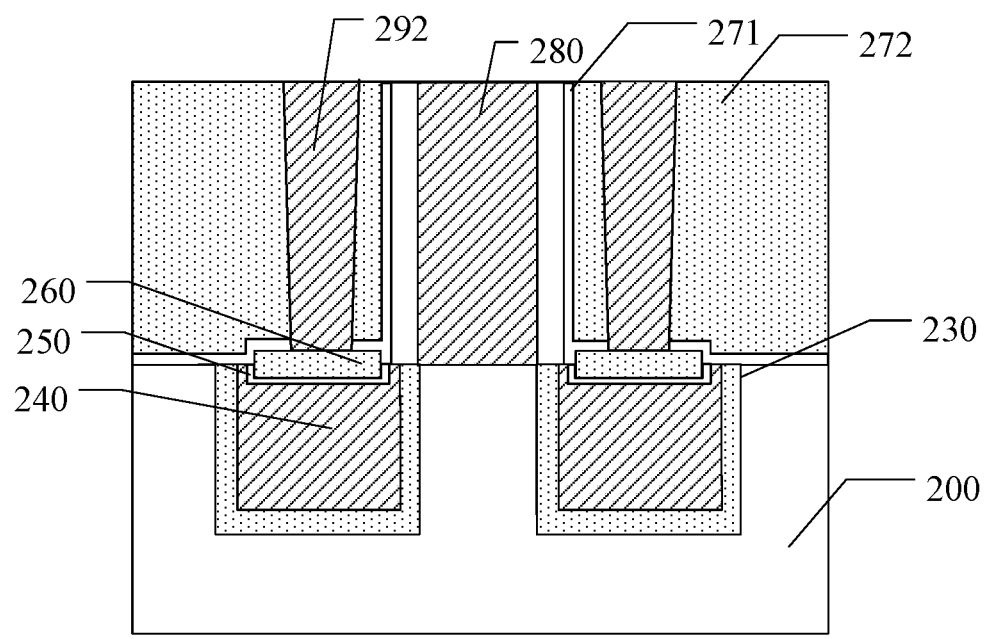

Returning to FIG. 20, after performing the ion implantation process, a conductive plug may be formed in the opening (S110). FIG. 14 illustrates a corresponding semiconductor structure.

Referring to FIG. 14, after performing the ion implantation process, a conductive plug 292 may be formed in the opening 291 (illustrated in FIG. 13). The conductive plug 292 may be made of a material including a metal, e.g., one or more of copper, tungsten, aluminum, titanium, nickel, titanium nitride, and tantalum nitride. In one embodiment, the conductive plug 292 may be made of tungsten.

Correspondingly, the present disclosure also provides a semiconductor structure formed by any one of the above-disclosed methods. Referring to FIG. 14, the semiconductor structure may include a substrate 200 and a gate structure 280 on the substrate 200. The substrate may contain source-drain openings 220 (illustrated in FIG. 6) in the substrate 200 on both sides of the gate structure 280. The semiconductor structure may also include a first stress layer 240 in each source-drain opening 220, and the first stress layer may be doped with first ions. In addition, the semiconductor structure may include a protection layer 260 on the first stress layer 240, and the protection layer 260 may be doped with second ions. Moreover, the semiconductor structure may include an inversion layer 250 disposed between the first stress layer 240 and the protection layer 260, and the inversion layer 250 may be doped with third ions. A conductivity type of the third ions may be opposite to a conductivity type of the second ions.

The inversion layer 250 may be disposed between the first stress layer 240 and the protection layer 260. At the same time, the protection layer 260 may be doped with second ions, and the inversion layer 250 may be doped with third ions. The conductivity type of the third ions may be opposite to the conductivity type of the second ions. Because the conductivity type of the inversion layer 250 is opposite to the conductivity type of the protection layer 260, the inversion layer 250 may block the doped ions in the protection layer 260, and may prevent the doped ions from diffusing into the region under the gate structure 280. In other words, the inversion layer may effectively reduce the influence on the channel width, and may improve the short-channel effect, which may facilitate to improve the performance of the formed semiconductor structure.

In one embodiment, a trench 241 (illustrated in FIG. 8) may be formed in the first stress layer 240, and the inversion layer 250 may be formed on the sidewall surface and the bottom surface of the trench 241.

In one embodiment, the protection layer 260 may be formed on the inversion layer 250, and may be in contact with the inversion layer 250. A thickness of the inversion layer 250 may be in a range of approximately 2 nm-5 nm. The concentration of the doped third ions in the inversion layer 250 may be in a range of approximately $1 \times 10^{19}$ atoms/cm$^3$-$5 \times 10^{19}$ atoms/cm$^3$.

The conductivity type of the first ions may be the same as the conductivity type of the second ions. Each of the first ions and the second ions may be an N-type ion or a P-type ion. The N-type ion may include phosphorus ion or arsenic ion. The P-type ion may include boron ion, indium ion, or BF$^{2+}$.

The third ions may be an N-type ion or a P-type ion. The N-type ion may include a phosphorous ion or arsenic ion. The P-type ion may include boron ion, indium ion, or BF$^{2+}$.

The semiconductor structure may further include a third stress layer 230 on the sidewall surface and bottom surface of the source-drain opening 220. The first stress layer 240 may be formed on the third stress layer 230. The third stress layer 230 may be doped with fourth ions, and the fourth ions may have a same conductivity type as the first ions.

The semiconductor structure may further include a stop barrier layer 271 on the protection layer 260 and on the sidewall surface of the gate structure 280, and a dielectric layer 272 on the stop barrier layer 271. The top surface of the dielectric layer 272 may be over or coplanar with the top surface of the gate structure 280. The dielectric layer 272 may include an opening (not illustrated) having a bottom exposing the top surface of the protection layer 260. The semiconductor structure may further include a conductive plug 292 in the opening.

In one embodiment, a portion of each of the protection layer 260, the inversion layer 250, and the first stress layer 240 may be further doped with fifth ions, and the conductivity type of the fifth ions may be the same as the conductivity type of the first ions.

The doped fifth ions may facilitate to reduce the resistivity and improve the conductivity. At the same time, the concentration of doped ions in the portion of the first stress layer 240 under the opening 291 may be substantially high. In other words, ions may be doped with a substantially high concentration within a substantially small range, and may not easily diffuse into the channel under the gate structure 280. Accordingly, the performance of the formed semiconductor structure may be further improved.

The gate structure may include a gate dielectric layer (not illustrated) on the substrate 200, a gate electrode layer (not illustrated) on the gate dielectric layer, and a sidewall spacer 213 on the sidewall surfaces of the gate dielectric layer and the gate electrode layer.

Figure 21:
FIG. 21 illustrates a flowchart of another exemplary method for forming a semiconductor structure consistent with various disclosed embodiments of the present disclosure.

FIG. 21 illustrates a flowchart of another method for forming a semiconductor structure consistent with various disclosed embodiments of the present disclosure, and FIGS. 15-19 illustrate semiconductor structures corresponding to certain stages of the fabrication method. The difference between the present embodiment associated with FIGS. 15-19 and the foregoing embodiment associated with FIGS. 5-14 may include that after forming the third stress layer, a first stress layer may be formed on the third stress layer; after forming the first stress layer, an inversion layer may be formed on the first stress layer; and after forming the inversion layer, a second stress layer may be formed on the inversion layer. Therefore, the method for forming the semiconductor structure in the present embodiment may be described on the basis of the foregoing embodiment.

Figure 15:
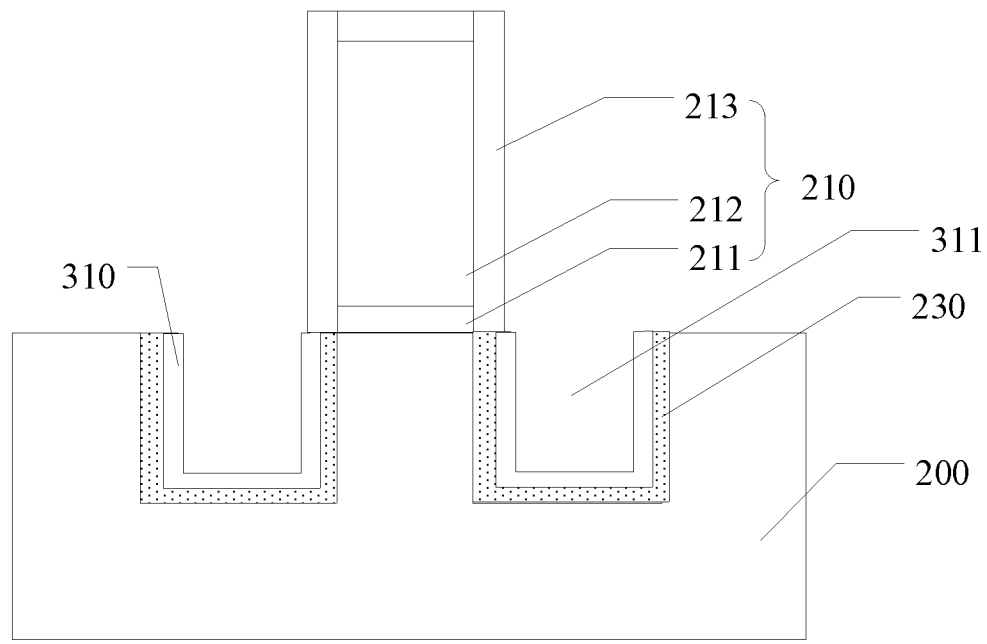
FIGS. 15-19 illustrate schematic diagrams of semiconductor structures corresponding to certain stages for forming another exemplary semiconductor structure consistent with various disclosed embodiments of the present disclosure.

As shown in FIG. 21, after forming the third stress layer, a first stress layer may be formed over the bottom and sidewall surfaces of each source-drain opening (S201). FIG. 15 illustrates a corresponding semiconductor structure.

FIG. 15 illustrates a semiconductor structure on the basis of FIG. 7. Referring to FIG. 15, after forming the third stress layer 230, a first stress layer 310 may be formed over the bottom and sidewall surfaces of each source-drain opening 220, and the first stress layer 310 may be doped with first ions.

In one embodiment, the first stress layer 310 may be formed on the third stress layer 230. The first stress layer 310 may have a trench 311 therein. Forming the first stress layer 310 may include a selective epitaxial growth process. The first stress layer 310 may be made of a same material as the first stress layer 240 in the foregoing embodiment, which may not be repeated herein.

Figure 16:
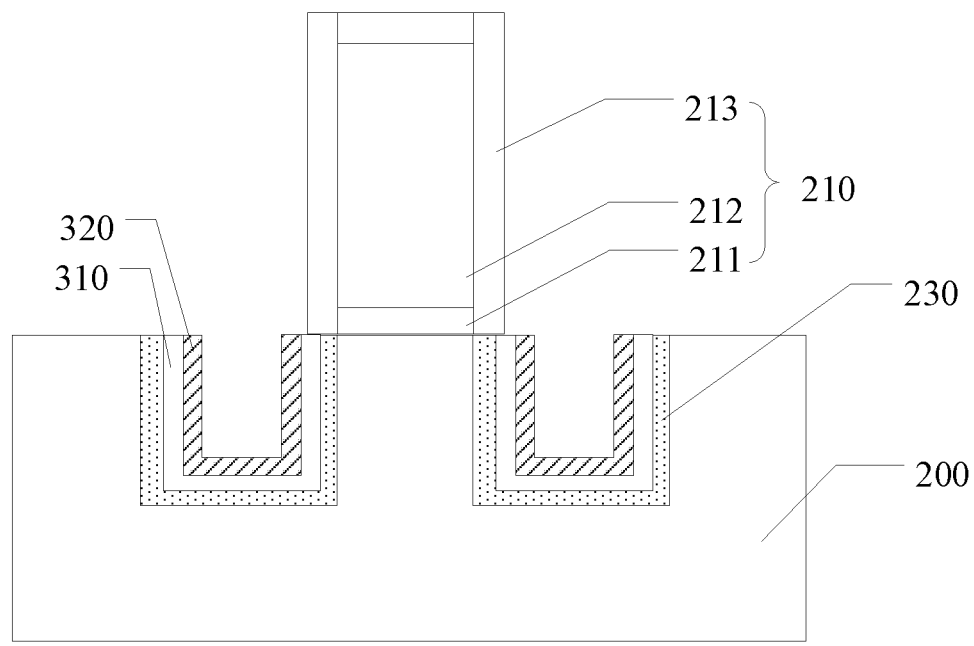

Returning to FIG. 21, after forming the first stress layer, an inversion layer may be formed on the first stress layer (S202). FIG. 16 illustrates a corresponding semiconductor structure.

Referring to FIG. 16, an inversion layer 320 may be formed on the first stress layer 311, and the inversion layer 320 may be doped with third ions. In one embodiment, the inversion layer 320 may be formed on the bottom surface and the sidewall surface of the trench 311.

The trench 311 may have a volume greater than the trench 241 in the foregoing embodiment. Therefore, the inversion layer formed on the bottom surface and the sidewall surface of the trench 311 may have a substantially large area, which may facilitate the inversion layer to fully block the doped ions in the protection layer.

The formation process and material of the inversion layer 320 may be the same as the formation process and material of the inversion layer 250 in the foregoing embodiment, which may not be repeated herein.

Figure 17:
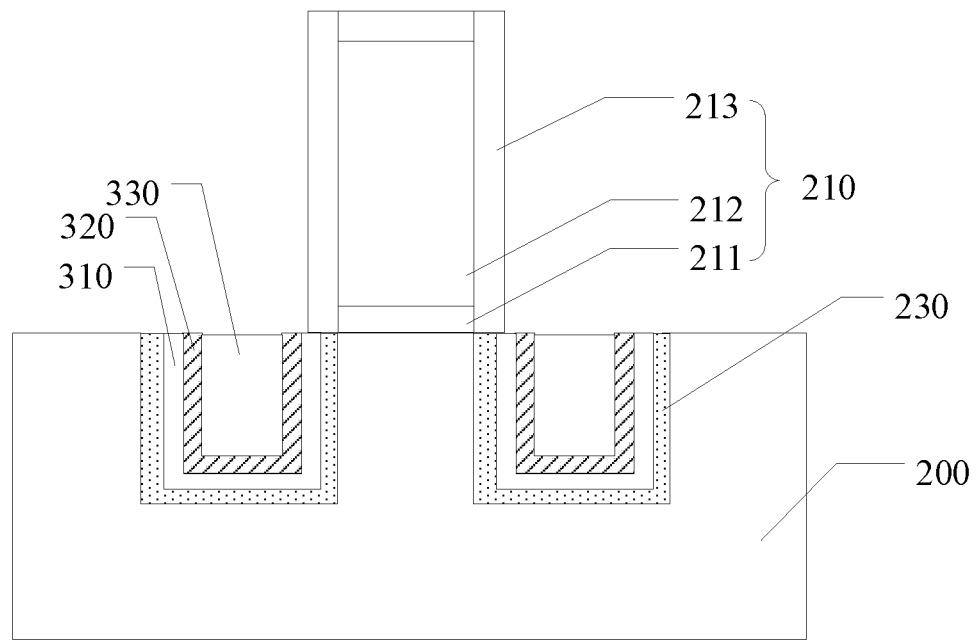

Returning to FIG. 21, after forming the inversion layer, a second stress layer may be formed on the inversion layer (S203). FIG. 17 illustrates a corresponding semiconductor structure.

Referring to FIG. 17, a second stress layer 330 may be formed on the inversion layer 320. The second stress layer 330 may be doped with first ions. Forming the second stress layer 330 may include a selective epitaxial growth process.

The formation process and material of the second stress layer 330 may be the same as the formation process and material of the first stress layer 240 in the above-mentioned embodiment, which may not be repeated herein.

In one embodiment, the second stress layer 330 may fully fill the source-drain opening 220. In certain embodiments, the second stress layer may not fully fill the source-drain opening.

Figure 18:
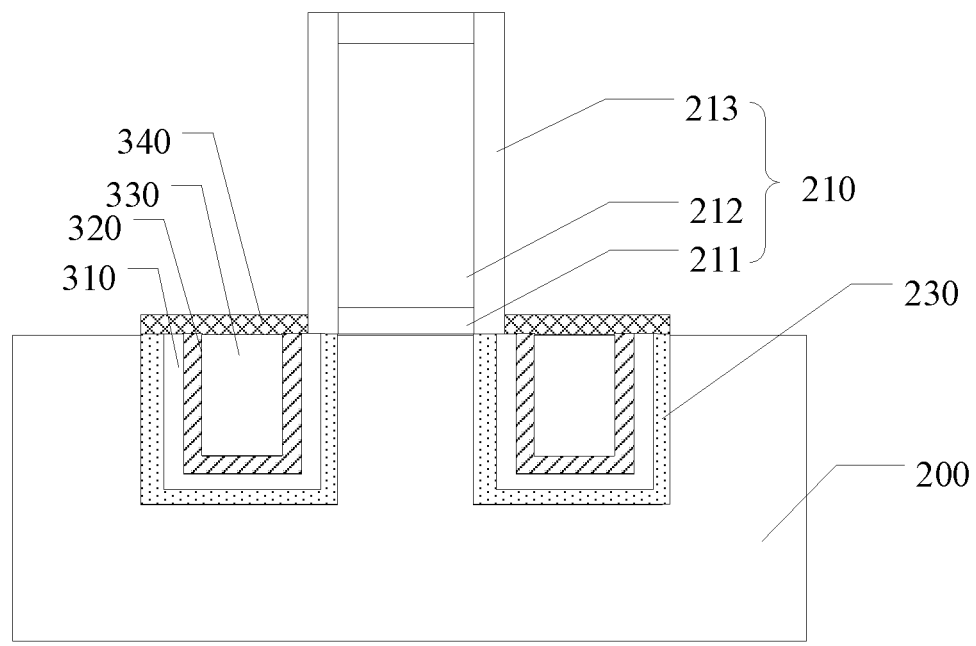

Returning to FIG. 21, after forming the second stress layer, a protection layer may be formed on the second stress layer (S204). FIG. 18 illustrates a corresponding semiconductor structure.

Referring to FIG. 18, a protection layer 340 may be formed on the second stress layer 330, and the protection layer 340 may be doped with second ions. A conductivity type of the second ions may be opposite to the conductivity type of the third ions. The conductivity type of the second ions may be the same as the conductivity type of the first ions.

The formation process and material of the protection layer 340 may be the same as the formation process and material of the protection layer 260 in the above-mentioned embodiment, which may not be repeated herein.

Figure 19:
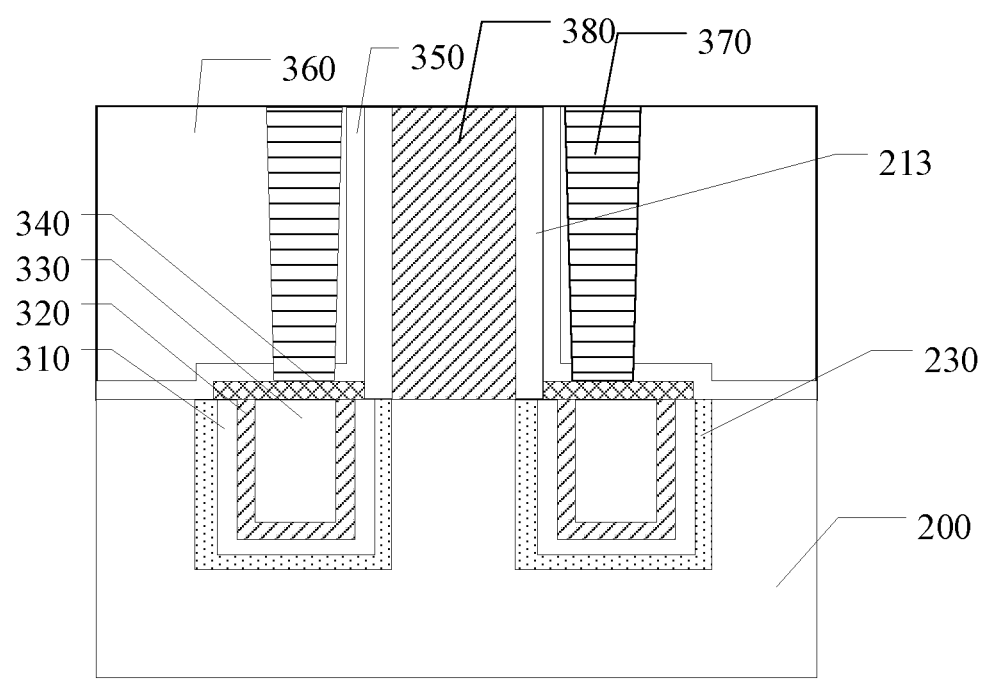

Returning to FIG. 21, after forming the protection layer, the following process may be the same as that in the embodiment associated with FIG. 21. FIG. 19 illustrates a corresponding semiconductor structure.

Referring to FIG. 19, a stop barrier layer 350 may be formed on the protection layer 340 and on the sidewall surface of the dummy gate structure 210. A dielectric layer 360 may be formed on the stop barrier layer 350, and a top surface of the dielectric layer 360 may be over or coplanar with the top surface of the dummy gate structure 210. An opening (not illustrated) may be formed in the dielectric layer 360, and the bottom of the opening may expose the top surface of the protection layer 340. An ion implantation process may be performed on the bottom of the opening, to dope the portion of the protection layer 340, the inversion layer 320, and the first stress layer 310 with fifth ions. A conductivity type of the fifth ions may be the same as the conductivity type of the first ions. After performing the ion implantation process, a conductive plug 370 may be formed in the opening.

In one embodiment, after forming the dielectric layer 360 and before forming the opening, the method may further include: removing the dummy gate structure 210 to form a dummy gate opening in the dielectric layer 360 (not illustrated); and forming a gate structure 380 in the dummy gate opening.

The formation process and material of the stop barrier layer 350 may be the same as the formation process and material of the stop barrier layer 271 in the foregoing embodiment, which may not be repeated herein.

The formation process and material of the dielectric layer 360 may be the same as the formation process and material of the dielectric layer 272 in the foregoing embodiment, which may not be repeated herein.

The formation method and material of the conductive plug 370 may be the same as the formation method and material of the conductive plug 292 in the foregoing embodiment, which may not be repeated herein.

The formation method and material of the gate structure 380 may be the same as the formation method and material of the gate structure 280 in the foregoing embodiment, which may not be repeated herein.

Correspondingly, the present disclosure also provides a semiconductor structure formed by any one of the above-disclosed methods. Referring to FIG. 19, the semiconductor structure may include a substrate 200, and a gate structure 380 on the substrate. The substrate may contain source-drain openings 220 (illustrated in FIG. 6) in the substrate 200 on both sides of the gate structure 380. The semiconductor structure may also include a first stress layer 310 each the source-drain opening 220, where the first stress layer may be doped with first ions. In addition, the semiconductor structure may include a protection layer 340 on the first stress layer 310, where the protection layer 340 may be doped with second ions. Moreover, the semiconductor structure may include an inversion layer 320 disposed between the first stress layer 310 and the protection layer 340, where the inversion layer 320 may be doped with third ions. A conductivity type of the third ions may be opposite to the conductivity type of the second ions.

The inversion layer 320 may be disposed between the first stress layer 310 and the protection layer 340. At the same time, the protection layer 340 may be doped with second ions, and the inversion layer 320 may be doped with third ions. The conductivity type of the third ions may be opposite to the conductivity type of the second ions. Because the conductivity type of the inversion layer 320 is opposite to the conductivity type of the protection layer 340, the inversion layer 320 may block the doped ions in the protection layer 340, and may prevent the doped ions in the protection layer 340 from diffusing into the region under the gate structure 380. In other words, the inversion layer may effectively reduce the influence on the channel width, and may improve the short-channel effect, which may facilitate to improve the performance of the formed semiconductor structure.

In one embodiment, a trench 311 may be formed in the first stress layer 310, and the inversion layer 320 may be formed on the sidewall surface and the bottom surface of the trench 311.

The inversion layer 320 may have a substantially large area, which may facilitate the inversion layer 320 to effectively block the doped ions in the protection layer 340, and may effectively prevent the doped ions in the protection layer 340 from diffusing into the region under the gate structure 380. Therefore, the inversion layer may effectively reduce the influence of the doped ions on the channel width, and may improve the short-channel effect, which may facilitate to improve the performance of the formed semiconductor structure.

A thickness of the inversion layer 320 may be in a range of approximately 2 nm-5 nm. The concentration of the doped third ions in the inversion layer 320 may be in a range of approximately $1 \times 10^{19}$ atoms/cm$^3$-$5 \times 10^{19}$ atoms/cm$^3$.

In one embodiment, the semiconductor structure may further include a second stress layer 330 on the inversion layer 320. The second stress layer 330 may be in contact with the inversion layer 320 and the protection layer 340

The conductivity type of the first ions may be the same as the conductivity type of the second ions. Each of the first ions and the second ions may be an N-type ion or a P-type ion. The N-type ion may include phosphorus ion or arsenic ion. The P-type ion may include boron ion, indium ion, or BF$^{2+}$.

The third ions may be an N-type ion or a P-type ion. The N-type ion may include a phosphorous ion or arsenic ion. The P-type ion may include boron ion, indium ion, or BF$^{2+}$.

The semiconductor structure may further include a third stress layer 230 on the sidewall surface and bottom surface of the source-drain opening 220. The first stress layer 310 may be formed on the third stress layer 230. The third stress layer 230 may be doped with fourth ions, and the fourth ions may have a same conductivity type as the first ions.

A portion of each of the protection layer 340, the inversion layer 320, and the first stress layer 310 may be further doped with fifth ions, and the conductivity type of the fifth ions may be the same as the conductivity type of the first ions.

The semiconductor structure may further include a stop barrier layer 350 on the protection layer 340 and the sidewall surface of the gate structure 380, a dielectric layer 360 on the stop barrier layer 350. The top surface of the dielectric layer 360 may be over or coplanar with the top surface of the gate structure 380. The dielectric layer 360 may include an opening having a bottom exposing the top surface of the protection layer 340. The semiconductor structure may further include a conductive plug 370 in the opening.

The gate structure may include a gate dielectric layer (not illustrated) on the substrate 200, a gate electrode layer (not illustrated) on the gate dielectric layer, and a sidewall spacer 213 on the sidewall surfaces of the gate dielectric layer and the gate electrode layer.

The disclosed embodiments may have following beneficial effects. In the disclosed semiconductor structure, the inversion layer may be formed between the first stress layer and the protection layer. The inversion layer may be doped with third ions, the protection layer may be doped with second ions, and the conductivity type of the third ions may be opposite to the conductivity type of the second ions. Because the conductivity type of the inversion layer is opposite to the conductivity type of the protection layer, the inversion layer may effectively block the doped ions in the protection layer, and may prevent the doped ions in the protection layer from diffusing into the region under the gate structure. In other words, the inversion layer may effectively reduce the influence of doped ions on the channel width, and may further improve the short-channel effect, which may facilitate to improve the performance of the formed semiconductor structure.

The semiconductor structure may further include a second stress layer on the inversion layer. The inversion layer may be formed between the first stress layer and the second stress layer. The inversion layer may have a substantially large area, which may facilitate the inversion layer to effectively block the doped ions in the protection layer, and may effectively prevent the doped ions in the protection layer from diffusing into the region under the gate structure. Therefore, the inversion layer may effectively reduce the influence of the doped ions on the channel width, and may improve the short-channel effect, which may facilitate to improve the performance of the formed semiconductor structure.

Further, a portion of each of the protection layer, the inversion layer, and the first stress layer may be doped with fifth ions, and the conductivity type of the fifth ions may be the same as the conductivity type of the first ions. Doping the fifth ions may facilitate to reduce the resistivity and improve the conductivity. At the same time, the concentration of doped ions in the first stress layer under the opening may be substantially high. In other words, ions may be doped with a substantially high concentration within a substantially small range, and may not easily diffuse into the channel under the gate structure. Accordingly, the performance of the formed semiconductor structure may be further improved.

In the disclosed method for forming a semiconductor structure, the inversion layer may be formed between the first stress layer and the protection layer. The inversion layer may be doped with third ions, the protection layer may be doped with second ions, and the conductivity type of the third ions may be opposite to the conductivity type of the second ions. Because the conductivity type of the inversion layer is opposite to the conductivity type of the protection layer, the inversion layer may effectively block the doped ions in the protection layer, and may prevent the doped ions in the protection layer from diffusing into the region under the gate structure. In other words, the inversion layer may effectively reduce the influence of doped ions on the channel width, and may further improve the short-channel effect, which may facilitate to improve the performance of the formed semiconductor structure.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure comprising:
   a substrate and a gate structure on the substrate, wherein the substrate contains source-drain openings on both sides of the gate structure;
   a first stress layer, formed in a source-drain opening of the source-drain openings, wherein the first stress layer is doped with first ions;
   a protection layer, over the first stress layer, wherein the protection layer is doped with second ions; and an inversion layer, between the first stress layer and the protection layer, wherein the inversion layer is doped with third ions, and a conductivity type of the third ions is opposite to a conductivity type of the second ions;

wherein a portion of each of the protection layer, the inversion layer, and the first stress layer is further doped with fourth ions, and a conductivity type of the fourth ions is the same as a conductivity type of the first ions.

2. The semiconductor structure according to claim 1, wherein: the first stress layer contains a trench, and the inversion layer is formed on sidewall and bottom surfaces of the trench.

3. The semiconductor structure according to claim 1, wherein: the protection layer is formed on the inversion layer, and is in contact with the inversion layer.

4. The semiconductor structure according to claim 1, further including: a second stress layer over the inversion layer, wherein the second stress layer is in contact with the inversion layer and the protection layer.

5. The semiconductor structure according to claim 1, wherein: a thickness of the inversion layer is in a range of approximately 2 nm-5 nm; and a concentration of the third ions doped in the inversion layer is in a range of approximately $1\times10^{19}$ atoms/cm$^3$-$5\times10^{19}$ atoms/cm$^3$.

6. The semiconductor structure according to claim 1, wherein: the first ions and the second ions have a same conductivity type, and each of the first ions and the second ions includes an N-type ion or a P-type ion, wherein: the N-type ion includes phosphorus ion or arsenic ion, and the P-type ion includes boron ion, indium ion, or $BF^{2+}$.

7. The semiconductor structure according to claim 1, further including: a third stress layer on sidewall and bottom surfaces of the source-drain opening, wherein:
the first stress layer is formed on the third stress layer, and
the third stress layer is doped with fifth ions, and the fifth ions have a same conductivity type as the first ions.

8. The semiconductor structure according to claim 1, further including:
a stop barrier layer on a surface of the protection layer and on a sidewall surface of the gate structure,
a dielectric layer on the stop barrier layer, wherein the dielectric layer has a top surface over or coplanar with a top surface of the gate structure, and the dielectric layer contains an opening having a bottom exposing a top surface of the protection layer, and
a conductive plug in the opening.

9. The semiconductor structure according to claim 1, wherein the gate structure includes:
a gate dielectric layer on the substrate, a gate electrode layer on the gate dielectric layer, and a sidewall spacer on sidewall surfaces of the gate dielectric layer and the gate electrode layer.

10. A method for forming a semiconductor structure, comprising:
providing a substrate and forming a dummy gate structure on the substrate;
forming source-drain openings in the substrate on both sides of the dummy gate structure;
forming a first stress layer in a source-drain opening of the source-drain openings, wherein the first stress layer is doped with first ions;

forming a protection layer over the first stress layer, wherein the protection layer is doped with second ions, the second ions including N-type ions or P-type ions; and
forming an inversion layer between the first stress layer and the protection layer, wherein the inversion layer is doped with third ions, and a conductivity type of the third ions is opposite to a conductivity type of the second ions, the third ions including P-type ions in response to the second ions including the N-type ions, and the third ions including the N-type ions in response to the second ions including the P-type ions.

11. The method according to claim 10, wherein:
the first stress layer contains a trench, and
the inversion layer is formed on sidewall and bottom surfaces of the trench.

12. The method according to claim 10, wherein:
before forming the protection layer, the inversion layer is formed.

13. The method according to claim 10, wherein:
forming the inversion layer includes a selective epitaxial growth process, and
doping the protection layer with the third ions includes an in-situ ion doping process.

14. The method according to claim 10, further including:
after forming the source-drain openings and before forming the first stress layer, forming a third stress layer on sidewall and bottom surfaces of the source-drain opening; and
after forming the third stress layer, forming the first stress layer in the source-drain opening, wherein the first stress layer is formed on the third stress layer.

15. The method according to claim 10, further including:
forming a stop barrier layer on the protection layer and on a sidewall surface of the dummy gate structure,
forming a dielectric layer on the stop barrier layer, wherein the dielectric layer has a top surface over or coplanar with a top surface of the dummy gate structure,
forming an opening in the dielectric layer, wherein the opening has a bottom exposing a top surface of the protection layer, and
forming a conductive plug in the opening.

16. The method according to claim 12, wherein:
after forming the first stress layer, the inversion layer is formed on the first stress layer, and
the protection layer is formed on the inversion layer.

17. The method according to claim 12, after forming the inversion layer and before forming the protection layer, further including:
forming a second stress layer on the inversion layer, and
forming the protection layer on the second stress layer.

18. The method according to claim 15, after forming the opening and before forming the conductive plug, further including:
performing an ion implantation process on the bottom of the opening, to dope a portion of each of the protection layer, the inversion layer, and the first stress layer with fifth ions, wherein a conductivity type of the fifth ions is the same as a conductivity type of the first ions.

* * * * *